(12) United States Patent
Inate

(10) Patent No.: US 10,790,803 B2
(45) Date of Patent: Sep. 29, 2020

(54) RADIO-FREQUENCY MODULE, MULTIPLEXER, AND MULTI-FILTER

(71) Applicant: Murata Manufacturing Co., Ltd., Nagaokakyo-shi, Kyoto-fu (JP)

(72) Inventor: Kenji Inate, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 78 days.

(21) Appl. No.: 16/234,664

(22) Filed: Dec. 28, 2018

(65) Prior Publication Data

US 2019/0140620 A1    May 9, 2019

Related U.S. Application Data

(63) Continuation of application No. PCT/JP2017/022235, filed on Jun. 15, 2017.

(30) Foreign Application Priority Data

Jun. 30, 2016    (JP) .................. 2016-131099

(51) Int. Cl.
 *H03H 9/72* (2006.01)
 *H03H 9/02* (2006.01)
 (Continued)

(52) U.S. Cl.
 CPC .......... *H03H 9/72* (2013.01); *H03H 9/02559* (2013.01); *H03H 9/02637* (2013.01);
 (Continued)

(58) Field of Classification Search
 CPC .. H03H 9/02; H03H 9/25; H03H 9/70; H03H 9/72
 See application file for complete search history.

(56) References Cited

U.S. PATENT DOCUMENTS 8,803,632 B2 * 8/2014 Takeuchi ................ H03H 7/38
                                                   333/101
9,077,439 B2 * 7/2015 Uejima ................ H04B 1/0057
(Continued)

FOREIGN PATENT DOCUMENTS

| JP | 2006-108734 A | 4/2006 |
| JP | 2008-533914 A | 8/2008 |
| JP | 2011-091484 A | 5/2011 |

OTHER PUBLICATIONS

Official Communication issued in International Patent Application No. PCT/JP2017/022235, dated Aug. 29, 2017.

*Primary Examiner* — Dean O Takaoka
*Assistant Examiner* — Alan Wong
(74) *Attorney, Agent, or Firm* — Keating & Bennett, LLP

(57) ABSTRACT

A radio-frequency module includes a multi-filter unit and a switch unit. The multi-filter unit includes filters having different passbands of signals and each including input/output terminals. The switch unit includes a receive/transmit terminal and a GND terminal. The switch unit switches the coupling destination of a second terminal in a second filter between the terminals. In the second filter, the second terminal is a common terminal coupled to a terminal, which is to be at the reference potential, of a first filter. When a first terminal of the first filter is to be coupled to the receive/transmit terminal terminal, the switch unit switches the coupling destination of the second terminal to the ground terminal.

20 Claims, 13 Drawing Sheets

(51) Int. Cl.
*H03H 9/25* (2006.01)
*H04B 1/44* (2006.01)
*H04B 1/00* (2006.01)
*H04B 1/48* (2006.01)
*H03H 9/145* (2006.01)
*H03H 9/64* (2006.01)

(52) U.S. Cl.
CPC .... *H03H 9/02834* (2013.01); *H03H 9/02937* (2013.01); *H03H 9/14541* (2013.01); *H03H 9/25* (2013.01); *H04B 1/00* (2013.01); *H04B 1/44* (2013.01); *H04B 1/48* (2013.01); *H03H 9/6483* (2013.01)

(56) References Cited

U.S. PATENT DOCUMENTS 10,476,531 B2 * 11/2019 Takenaka ............... H04B 1/401
2006/0205352 A1   9/2006 Bialek et al.

* cited by examiner

RADIO-FREQUENCY MODULE, MULTIPLEXER, AND MULTI-FILTER

CROSS REFERENCE TO RELATED APPLICATIONS

This application claims the benefit of priority to Japanese Patent Application No. 2016-131099 filed on Jun. 30, 2016 and is a Continuation Application of PCT Application No. PCT/JP2017/022235 filed on Jun. 15, 2017. The entire contents of each application are hereby incorporated herein by reference.

BACKGROUND OF THE INVENTION

1. Field of the Invention

The present invention relates to a radio-frequency module, a multiplexer, and a multi-filter.

2. Description of the Related Art

Recently, to reduce the size of radio-frequency modules for communication and their application to multi-bands, radio-frequency modules and the like, in which multiple filter circuits are formed on a single chip, have been developed (for example, see Japanese Unexamined Patent Application Publication No. 2006-108734). A branching filter described in Japanese Unexamined Patent Application Publication No. 2006-108734 switches the state of coupling the antenna terminal to multiple filter circuits, and thus selects, in combination, any of the filter circuits in accordance with frequency bands for reception/transmission. Accordingly, a single radio-frequency module may be compatible with multiple frequency bands without changing the circuit design.

However, there arises a problem in that it is not possible to provide a sufficient number of GND terminals on a single chip (piezoelectric substrate) having multiple filter circuits formed thereon.

As described above, the branching filter described in Japanese Unexamined Patent Application Publication No. 2006-108734 switches the state of coupling to the filter circuits by using switches, thus switching systems (frequency bands) that are to be used. At that time, the input terminal of a filter that is not being used is not coupled to the GND, and is in the electrically isolated state (a HOT terminal). Therefore, even though the branching filter does not require bundling together the input terminals of the filter circuits, the branching filter has a problem of requiring an increased number of HOT terminals on the chip.

When multiple filters in which HOT terminals are independent (not bundled together) are formed on a single chip, the number of HOT terminals is required by be equal to twice the number of filters (in the case of unbalanced filters; in the case of balanced filters, the number of HOT terminals is required to be equal to or greater than twice the number of filters). In addition, to obtain good filter characteristics, enough GND terminals assigned to the filters are necessary. However, restriction on the chip size limits the number of terminals disposed on a single chip. Therefore, the more the terminals assigned as HOT terminals are, the fewer the terminals assigned as GND terminals are. For example, if three independent unbalanced filters are to be formed on a chip having eight terminals (bumps), since six (3×2=6) terminals are assigned as HOT terminals, only the remaining two (=8−3×2) terminals are able to be assigned as GND terminals. Therefore, it is difficult to achieve both good filter characteristics and a reduction in chip size.

SUMMARY OF THE INVENTION

Preferred embodiments of the present invention provide radio-frequency modules, multiplexers, and multi-filters each of which achieve both good filter characteristics and a reduction in size.

A radio-frequency module according to a preferred embodiment of the present invention includes a multi-filter unit and a switch unit. The multi-filter unit includes a plurality of circuit devices having different passbands of signals. For each of the plurality of circuit devices, a plurality of input/output terminals are provided. The plurality of input/output terminals are terminals through which the signals are input or output. The switch unit includes a receive/transmit terminal and a GND terminal. The receive/transmit terminal is a terminal to receive/transmit the signals. The switch unit switches coupling destinations to the receive/transmit terminal or the GND terminal. The coupling destinations are destinations of the input/output terminals of the plurality of circuit devices. In a first circuit device among the plurality of circuit devices, at least one of the input/output terminals is a common terminal coupled to a terminal in a second circuit device. The terminal in the second circuit device is to be at a reference potential. The second circuit device is different from the first circuit device and is among the plurality of circuit devices. When one of the input/output terminals of the second circuit device is to be coupled to the receive/transmit terminal, the switch unit switches the coupling destination of the common terminal to the GND terminal.

Thus, the terminal, which is to be at the reference potential, of a parallel arm resonator of the second circuit device is coupled to the common terminal. Therefore, the terminal, which is to be at the reference potential, of the parallel arm resonator may be coupled to the GND terminal. This improves the filter characteristics of the radio-frequency module. In addition, it is not necessary to include a new terminal to couple the terminal, which is to be at the reference potential, of the parallel arm resonator of the second circuit device to the GND terminal. Therefore, the number of terminals on a single chip is not changed. Accordingly, an increase in the size of the radio-frequency module is able to be reduced or prevented, thus achieving a reduction in size.

When the input/output terminal of the first circuit device is to be coupled to the receive/transmit terminal, the switch unit may make the input/output terminal of the second circuit device open.

Thus, the filter characteristics of the first and second circuit devices are able to be improved.

When the input/output terminal of the first circuit device is to be coupled to the receive/transmit terminal, the switch unit may couple the input/output terminal of the second circuit device to the GND terminal.

Thus, the filter characteristics of the first and second circuit devices are able to be further improved.

At least one of the circuit devices may be a surface acoustic wave filter.

Thus, the radio-frequency module including a surface acoustic wave filter achieves both good filter characteristics and a reduction in the size.

The surface acoustic wave filter may be a ladder filter circuit including one or more serial arm resonators and one or more parallel arm resonators. A terminal that is to be at the reference potential in at least one of the parallel arm resonators may be coupled to the common terminal.

Thus, the surface acoustic wave filter having a ladder configuration achieves good filter characteristics.

The plurality of circuit devices may be provided on the same chip.

Thus, multiple circuit devices provided on the same chip may commonly use a terminal provided on the chip. Therefore, a reduction in the size of the radio-frequency module is achieved.

The multi-filter unit may include, on the same chip, a plurality of sets of different combinations of the first circuit device and the second circuit device, and, in each of the different combinations of the first circuit device and the second circuit device, the first circuit device may include the common terminal.

Thus, multiple common terminals are provided for combinations of multiple circuit devices. Accordingly, the terminals provided on the chip may be commonly used by the circuit devices. Therefore, the number of terminals to be used is able to be decreased, so as to more effectively achieve a reduction in the size of the radio-frequency module.

A multiplexer according to a preferred embodiment of the present invention includes a plurality of the radio-frequency modules having the above-described characteristics.

Thus, the filter characteristics of the radio-frequency modules in the multiplexer are able to be improved, and a reduction in the size is achieved. Accordingly, in the entire multiplexer, the filter characteristics are able to be improved, and a reduction in the size is achieved.

A multi-filter according to a preferred embodiment of the present invention, the multi-filter is a filter included, as the multi-filter unit, in the radio-frequency module having the above-described characteristics.

Thus, in the multi-filter, the filter characteristics are able to be improved, and a reduction in the size is achieved.

Preferred embodiments of the present invention provide radio-frequency modules, multiplexers, and multi-filters each of which achieve both good filter characteristics and a reduction in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
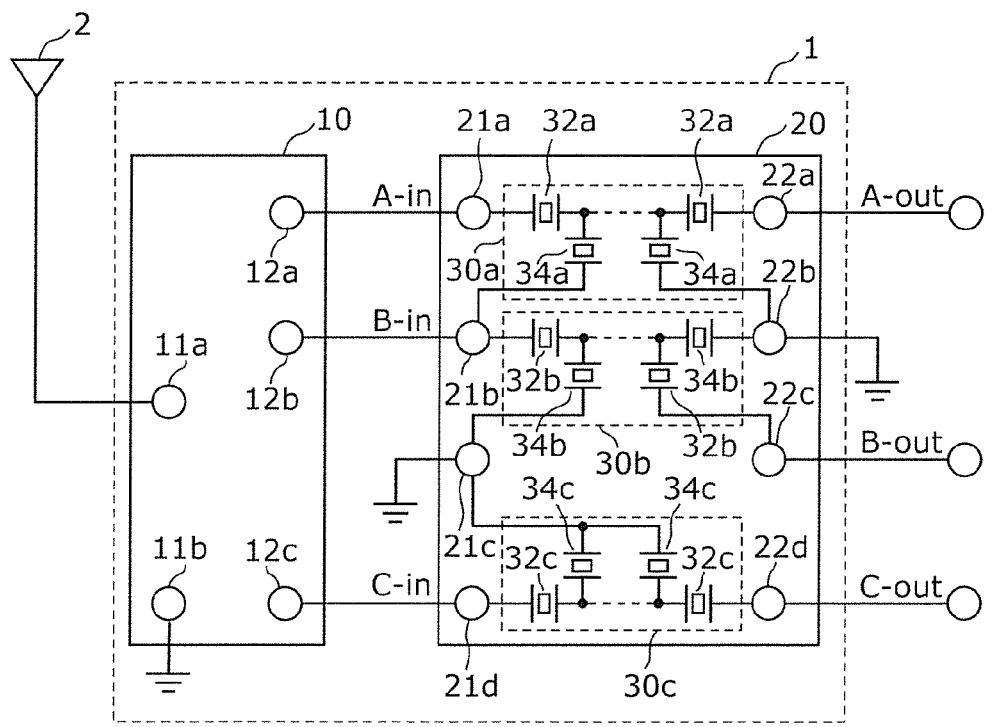
FIG. 1A is a conceptual diagram illustrating the configuration of a radio-frequency module according to a first preferred embodiment of the present invention.

Preferred embodiments of the present invention will be described below with reference to the accompanying drawings. The preferred embodiments described below are specific preferred examples of the present invention. Therefore, for example, values, shapes, materials, components, the positions and the connection structures of components, which are described in the preferred embodiments below, are exemplary, and are not intended to limit the present invention. Therefore, among the components according to the preferred embodiments described below, components which are not described in the independent claims indicating the highest concepts of the present invention are described as optional components.

The drawings illustrate schematic diagrams, and are not necessarily strict illustrations. In the drawings, the same reference characters are denoted for the same or substantially the same configurations, and repeated description will be omitted or simplified.

First Preferred Embodiment

A first preferred embodiment of the present invention will be described by using FIGS. 1A to 7.

A typical configuration of a radio-frequency module 1 according to the present preferred embodiment will be described. FIG. 1A is a conceptual diagram illustrating the configuration of the radio-frequency module 1 according to the present preferred embodiment.

As illustrated in FIG. 1A, the radio-frequency module 1 according to the present preferred embodiment, which is coupled to an antenna 2, includes, for example, a multi-filter in which, for example, upstream frequencies (transmit bands) and downstream frequencies (receive bands) in Band 7, Band 30, Band 38, and other suitable frequencies of LTE (Long Term Evolution) are preferably used as a passband. The radio-frequency module 1 includes a switch unit 10 and a multi-filter unit 20.

The switch unit 10 is a switch to distribute, to a filter corresponding to a given frequency band, a radio-frequency transmit signal, which is to be transmitted from the antenna 2, or a radio-frequency receive signal, which is received from the antenna 2.

The switch unit 10 includes terminals 11a, 11b, 12a, 12b, and 12c. The terminal 11a is coupled to the antenna 2 and through which signals are received or transmitted from/to the antenna 2. That is, the terminal 11a corresponds to a receive/transmit terminal. The terminal 11b is coupled to a GND terminal of the mount board (not illustrated) of the radio-frequency module 1.

The terminals 12a, 12b, and 12c are output terminals through which signals are output to the multi-filter unit 20 located downstream. The terminals 12a, 12b, and 12c of the switch unit 10 are coupled to terminals 21a, 21b, and 21d of the multi-filter unit 20, respectively.

The multi-filter unit 20 is preferably a 3in3out triple SAW filter in which, for example, surface acoustic wave filters (SAW filters) corresponding to Band 7 (receive band: about 2620 MHz to about 2690 MHz), Band 30 (receive band: about 2350 MHz to about 2360 MHz), Band 38 (receive band: about 2570 MHz to about 2620 MHz), and other bands are provided on a single chip (piezoelectric substrate).

As illustrated in FIG. 1A, the multi-filter unit 20 includes filters 30a, 30b, and 30c whose corresponding frequency bands are different from each other, and also includes terminals 21a, 21b, 21c, 21d, 22a, 22b, 22c, and 22d.

The filter 30a is preferably, for example, a SAW filter corresponding to Band 7. As described below, the filter 30a includes at least one serial arm resonator 32a and at least one parallel arm resonator 34a between the terminal 21a and the terminal 22a. The filter 30a corresponds to a second circuit device.

The filter 30b is preferably, for example, a SAW filter corresponding to Band 30. The filter 30c is preferably, for example, a SAW filter corresponding to Band 38. As described below, the filter 30b includes at least one serial arm resonator 32b and at least one parallel arm resonator 34b between the terminal 21b and the terminal 22c. The filter 30b corresponds to a first circuit device.

The filter 30c is preferably, for example, a SAW filter corresponding to Band 38. As described below, the filter 30c includes at least one serial arm resonator 32c and at least one parallel arm resonator 34c between the terminal 21d and the terminal 22d.

The configuration of the serial arm resonators 32a, 32b, and 32c and the configuration of the parallel arm resonators 34a, 34b, and 34c are preferably the same or substantially the same. The configuration of the parallel arm resonator 34a will be described below.

Figure 1B:
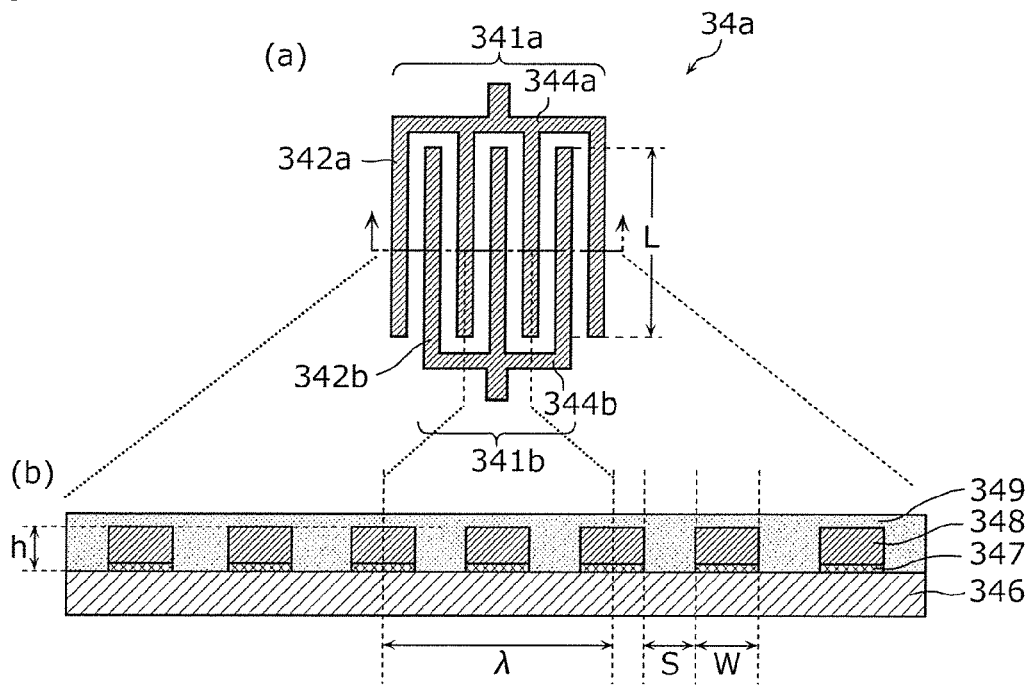
FIG. 1B includes schematic views of the configuration of a parallel arm resonator.

FIG. 1B includes schematic views of the configuration of the parallel arm resonator 34a. FIG. 1B(a) is a plan view of the configuration, and FIG. 1B(b) is a section view of the configuration taken along the long dashed short dashed line in FIG. 1B(a).

As illustrated in FIGS. 1B(a) and 1B(b), the parallel arm resonator 34a is a surface acoustic wave resonator, and includes a piezoelectric substrate 346 and IDT (interdigital transducer) electrodes 341a and 341b having comb shapes.

The piezoelectric substrate 346 is preferably made, for example, of $LiTaO_3$ monocrystal which is cut with a given Cut-Angle. In the piezoelectric substrate 346, surface acoustic waves are propagated in a given direction.

As illustrated in FIG. 1B(a), a pair of the IDT electrodes 341a and 341b facing each other are provided on the piezoelectric substrate 346. The IDT electrode 341a includes multiple electrode fingers 342a parallel or substantially parallel to one another, and a busbar electrode 344a coupling the electrode fingers 342a to one another. The IDT electrode 341b includes multiple electrode fingers 342b parallel or substantially parallel to one another, and a busbar electrode 344b coupling the electrode fingers 342b to one another. The IDT electrode 341a and the IDT electrode 341b are configured such that, between adjacent ones of the electrode fingers 342a of the IDT electrode 341a, a corresponding one of the electrode fingers 342b of the IDT electrode 341b is disposed.

As illustrated in FIG. 1B(b), the IDT electrode 341a and the IDT electrode 341b includes an adhesive layer 347 and a main electrode layer 348 that are laminated one on top of the other.

The adhesive layer 347 improves the adhesiveness between the piezoelectric substrate 346 and the main electrode layer 348, and, for example, Ti is preferably used as the material of the adhesive layer 347. The film thickness of the adhesive layer 347 is preferably, for example, about 12 nm.

For example, Al including about 1% of Cu is preferably used as the material of the main electrode layer 348. The main electrode layer 348 has a uniform film thickness, and is preferably, for example, about 130 nm. This enables a manufacturing process to be simplified, thus achieving low cost.

A protective layer 349 covers the IDT electrodes 341a and 341b. The protective layer 349 protects the main electrode layer 348 from the external environment, adjusts the frequency temperature characteristics, and improves the moisture resistance. The protective layer 349 is a film whose main component is preferably, for example, silicon dioxide. The protective layer 349 may have a uniform film thickness.

The materials of which the adhesive layer 347, the main electrode layer 348, and the protective layer 349 are made are not limited to the materials described above. In addition, the IDT electrode 341a and 341b do not necessarily have the layered structure described above. The IDT electrodes 341a and 341*b* may be made, for example, of a metal, such as Ti, Al, Cu, Pt, Au, Ag, or Pd, or an alloy, and may be defined by multiple multilayer bodies made of the metals or the alloy described above. In addition, the protective layer 349 may not be included.

The structure of the parallel arm resonator 34*a* is not limited to the structure illustrated in FIGS. 1B(a) and 1B(b). For example, the IDT electrodes 341*a* and 341*b* may not have the layered structure of metal films, and may be a single metal film layer. In addition, the parallel arm resonator 34*a* may include reflectors on the both sides of the IDT electrodes 341*a* and 341*b* in the travelling direction of surface acoustic waves such that the IDT electrodes 341*a* and 341*b* are interposed therebetween.

The filters 30*a*, 30*b*, and 30*c* may preferably define a ladder filter, for example, by including at least one serial arm resonator and at least one parallel arm resonator. Not limited to pure ladder filters, the filters 30*a*, 30*b*, and 30*c* may further include a longitudinally coupled filter 35 (see FIG. 1C).

Figure 1C:
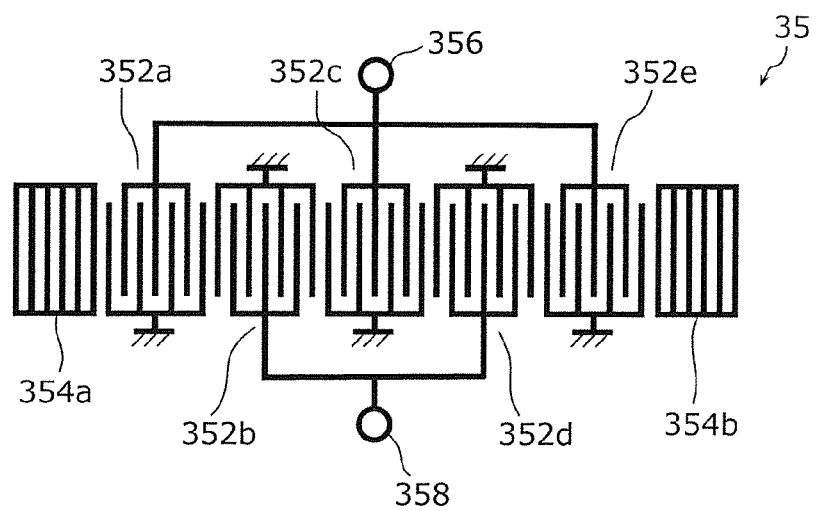
FIG. 1C is a schematic plan view of an exemplary configuration of a longitudinally coupled filter.

FIG. 1C is a schematic plan view of an exemplary configuration of the longitudinally coupled filter 35.

As illustrated in FIG. 1C, the longitudinally coupled filter 35 includes longitudinally coupled resonators 352*a* to 352*e*, reflectors 354*a* and 354*b*, an input port 356, and an output port 358.

Each of the longitudinally coupled resonators 352*a* to 352*e* includes a pair of IDT electrodes facing each other. The longitudinally coupled resonators 352*b* and 352*d* are disposed with the longitudinally coupled resonator 352*c* interposed therebetween. The longitudinally coupled resonators 352*a* and 352*e* are disposed with the longitudinally coupled resonators 352*b* to 352*d* interposed therebetween. The longitudinally coupled resonators 352*a*, 352*c*, and 352*e* are coupled in parallel between the input port 356 and reference terminals (ground). The longitudinally coupled resonators 352*b* and 352*d* are coupled in parallel between the output port 358 and reference terminals.

The filters 30*a*, 30*b*, and 30*c* are not limited to SAW filters, and may be other filters. Besides a filter, another circuit device, such as a switching device, for example, may be used. The detailed configuration of the filters 30*a*, 30*b*, and 30*c* and the differences between the filters 30*a*, 30*b*, and 30*c* will be described below.

The terminals 21*a*, 21*b*, and 21*d* are terminals through which signals are input or output from/to the terminals 12*a*, 12*b*, and 12*c*, respectively, of the switch unit 10. That is, the terminals 21*a*, 21*b*, and 21*d* correspond to input/output terminals. The terminals 21*a*, 21*b*, and 21*d* are HOT terminals. The terminal 21*c* is coupled to a GND terminal of the mount board (not illustrated) of the radio-frequency module 1.

The terminals 22*a*, 22*c*, and 22*d* are coupled from the multi-filter unit 20 to downstream circuits (not illustrated). The terminals 22*a*, 22*c*, and 22*d* are terminals through which signals are input or output between the multi-filter unit 20 and the respective downstream circuits. The terminal 22*b* is coupled to a GND terminal of the mount board of the radio-frequency module 1.

Figure 2A:
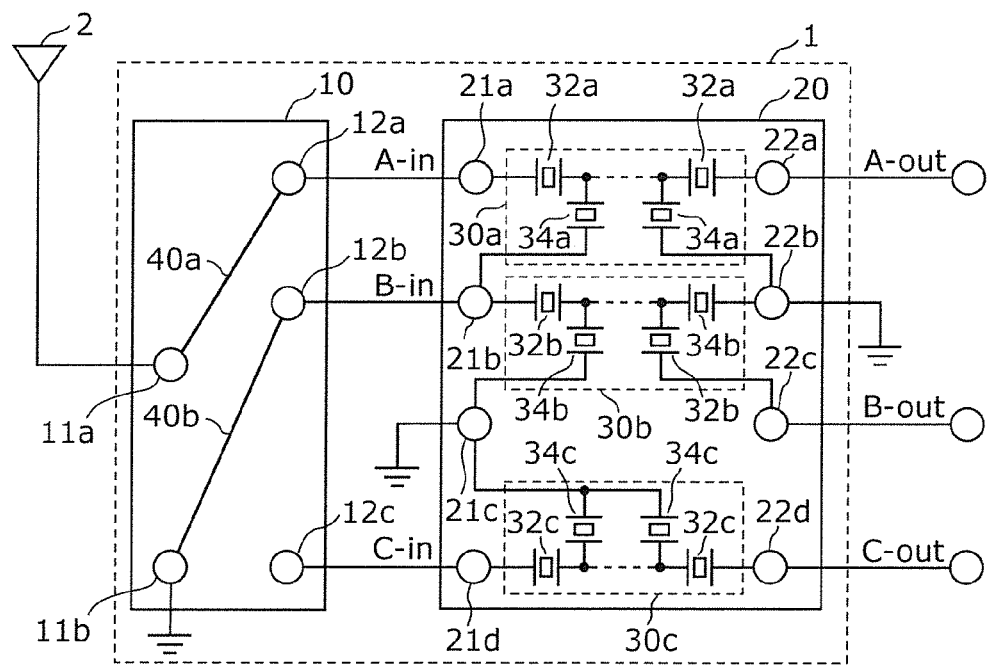
FIG. 2A is a diagram illustrating exemplary coupling using switches which are included in the case in which a filter 30a is provided, in a radio-frequency module according to the first preferred embodiment of the present invention.

As illustrated in FIG. 2A and as described below, the switch unit 10 includes switches 40*a* and 40*b*. The switch unit 10 couples the terminal 11*a* to the terminal 12*a* using the switch 40*a*. The switch unit 10 couples the terminal 11*b* to the terminal 12*b* using the switch 40*b*. The switch unit 10 switches the coupling target of the terminal 12*b* to the terminal 11*a* using the switch 40*b*. Thus, the switch unit 10 couples the terminal 11*a* to the terminal 12*b*. That is, the switch 40*b* switches the coupling target of the terminal 12*b* between the terminal 11*a*, which is a receive/transmit terminal for reception/transmission of signals, and the terminal 11*b*, which is a GND terminal.

Figure 2B:
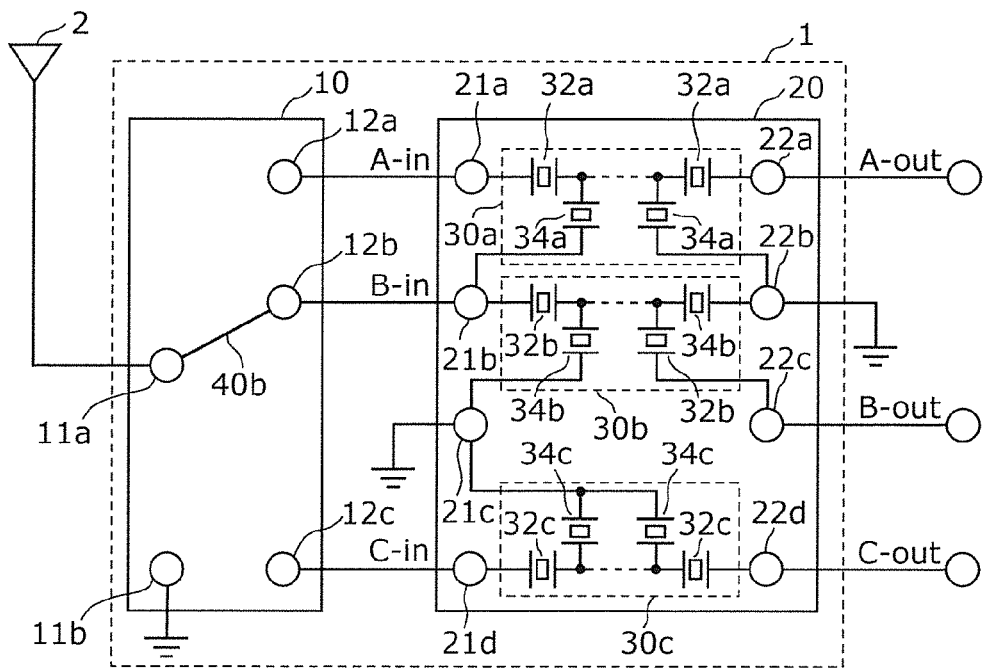
FIG. 2B is a diagram illustrating exemplary coupling using switches which are included in the case in which a filter 30b is provided, in a radio-frequency module according to the first preferred embodiment of the present invention.

FIG. 2A is a diagram illustrating exemplary coupling using switches which is used in the case in which the filter 30*a* is used, in the radio-frequency module 1 according to the present preferred embodiment. FIG. 2B is a diagram illustrating exemplary coupling using switches which is used in the case in which the filter 30*b* is used, in the radio-frequency module 1 according to the present preferred embodiment.

Description will be provided below by taking, as an example, the case in which the filters 30*a*, 30*b*, and 30*c* are receive filters of Band 7, Band 30, and Band 38, respectively. Therefore, the terminals 21*a*, 21*b*, and 21*d* are input terminals to which signals are input, and the terminals 22*a*, 22*c*, and 22*d* are output terminals from which signals are output.

Figure 3A:
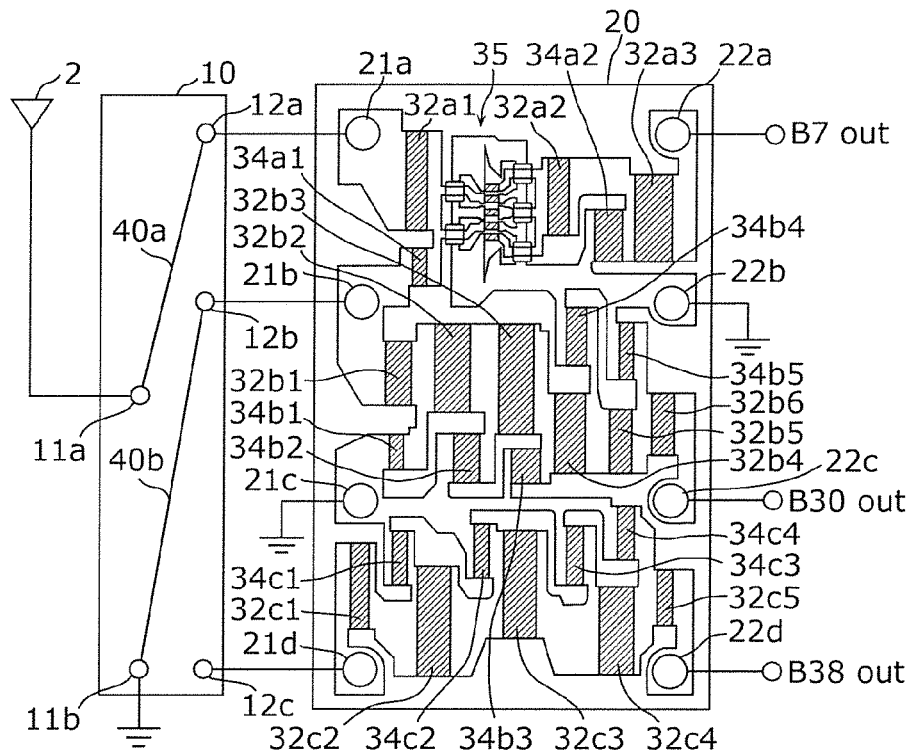
FIG. 3A is a schematic plan view of the circuit configuration used in the case in which the filter 30a (Band 7) is provided, in a radio-frequency module according to the first preferred embodiment of the present invention.
Figure 3B:
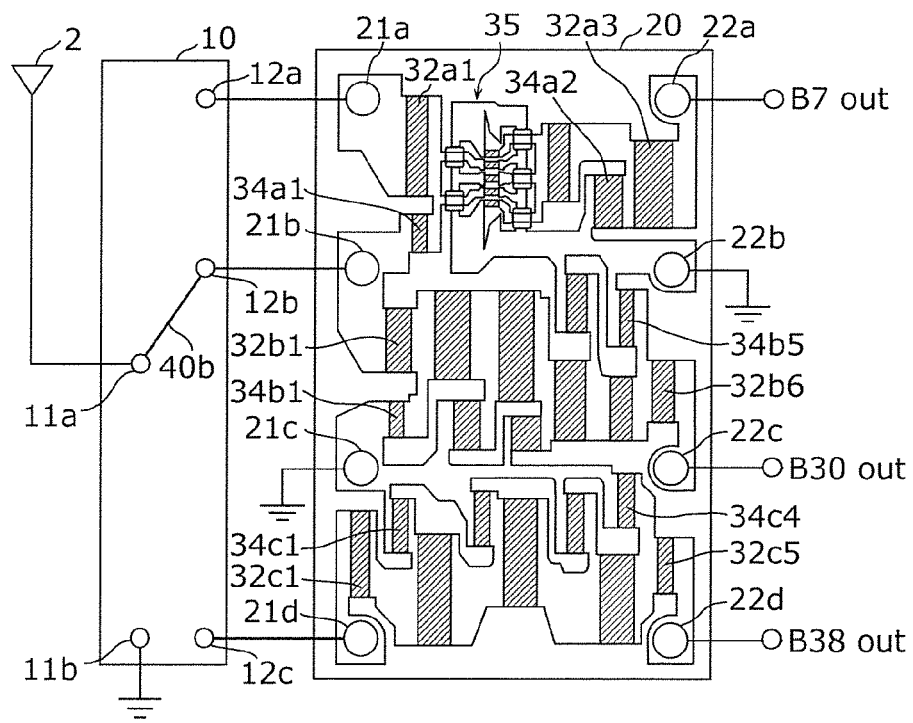
FIG. 3B is a schematic plan view of the circuit configuration used in the case in which the filter 30b (Band 30) is provided, in a radio-frequency module according to the first preferred embodiment of the present invention.

FIG. 3A is a schematic plan view of the circuit configuration used in the case in which the filter 30*a* is used, in the radio-frequency module 1 according to the present preferred embodiment. FIG. 3B is a schematic plan view of the circuit configuration used in the case in which the filter 30*b* is used, in the radio-frequency module 1 according to the present preferred embodiment. That is, FIGS. 3A and 3B illustrate specific configurations of the circuits illustrated in FIGS. 2A and 2B. In FIG. 3B, to make the drawing easy to view and understand, reference characters are provided only for main serial arm resonators and parallel arm resonators, and reference characters are not provided for the other serial arm resonators and parallel arm resonators.

In the case in which Band 7 is used in the radio-frequency module 1, as illustrated in FIG. 3A, the terminal 11*a* is coupled to the terminal 12*a* using the switch 40*a* in the switch unit 10. The terminal 11*b* is coupled to the terminal 12*b* using the switch 40*b*. Thus, the terminal 21*b* of the filter 30*a* (see FIG. 2A) which is the receive filter of Band 7 is coupled to the GND terminal via the terminal 12*b* and the terminal 11*b*.

As illustrated in FIG. 3A, the receive filter of Band 7 includes a ladder filter and the longitudinally coupled filter 35. The ladder filter includes three serial arm resonators 32*a*1, 32*a*2, and 32*a*3 and two parallel arm resonators 34*a*1 and 34*a*2. The receive filter of Band 7 is coupled between the terminal 21*a* and the terminal 22*a*.

The terminal 21*a*, which is an input terminal, is coupled to the terminal 12*a* of the switch unit 10. The terminal 22*a*, which is an output terminal, is coupled to a circuit downstream of the receive filter of Band 7. The terminal 22*a* transmits, to the downstream circuit, a signal received from the antenna 2.

In the receive filter of Band 7, the serial arm resonator 32*a*1, the parallel arm resonator 34*a*1, the longitudinally coupled filter 35, the serial arm resonator 32*a*2, the parallel arm resonator 34*a*2, and the serial arm resonator 32*a*3 are disposed in this order from the terminal 21*a* to the terminal 22*a*. The parallel arm resonator 34*a*1 disposed closest to the terminal 21*a* includes one end coupled between the serial arm resonator 32*a*1 and the longitudinally coupled filter 35, and the other end coupled to the terminal 21*b* described below. The parallel arm resonator 34*a*2 disposed closest to the terminal 22*a* includes one end coupled between the serial arm resonator 32*a*3 closest to the terminal 22*a* and the different serial arm resonator 32*a*2 coupled in series to the serial arm resonator 32*a*3, and the other end coupled to the terminal 22*b*.

The other end of the parallel arm resonator 34a1 disposed closest to the terminal 21a is coupled to a terminal which is to be at the reference potential in the receive filter of Band 7. Similarly, the other end of the parallel arm resonator 34a2 disposed closest to the terminal 22a is coupled to a terminal which is to be at the reference potential in the receive filter of Band 7. The reference potential is, for example, the GND potential. The terminal 21b corresponds to a common terminal.

The receive filter of Band 7 is coupled to the GND terminal of the switch unit 10 via the terminal 21b, the terminal 12b, and the terminal 11b. This configuration causes the receive filter of Band 7 to pass a receive signal of Band 7.

As illustrated in FIG. 3A, the filter 30b (see FIG. 2A), which is the receive filter of Band 30, includes a ladder filter including six serial arm resonators 32b1, 32b2, 32b3, 32b4, 32b5, and 32b6 and five parallel arm resonators 34b1, 34b2, 34b3, 34b4, and 34b5. The receive filter of Band 30 is coupled between the terminal 21b and the terminal 22c.

In the receive filter of Band 30, each of the five parallel arm resonators 34b1, 34b2, 34b3, 34b4, and 34b5 is coupled between the corresponding adjacent pair of the six serial arm resonators 32b1, 32b2, 32b3, 32b4, 32b5, and 32b6 from the terminal 21b to the terminal 22c. The parallel arm resonator 34b1 disposed closest to the terminal 21b includes one end coupled between the serial arm resonator 32b1 closest to the terminal 21b and the different serial arm resonator 32b2 coupled in series to the serial arm resonator 32b1, and the other end coupled to the terminal 21c. The parallel arm resonator 34b5 disposed closest to the terminal 22c includes one end coupled between the serial arm resonator 32b6 closest to the terminal 22c and the different serial arm resonator 32b5 coupled in series to the serial arm resonator 32b6, and the other end coupled to the terminal 22b of the receive filter of Band 30 described below. This configuration causes the receive filter of Band 30 to pass a receive signal of Band 30.

As illustrated in FIG. 3A, the filter 30c (see FIG. 2A), which is the receive filter of Band 38, includes a ladder filter including five serial arm resonators 32c1, 32c2, 32c3, 32c4, and 32c5 and four parallel arm resonators 34c1, 34c2, 34c3, and 34c4. The receive filter of Band 38 is coupled between the terminal 21d and the terminal 22d.

In the receive filter of Band 38, each of the four parallel arm resonators 34c1, 34c2, 34c3, and 34c4 is coupled between the corresponding adjacent pair of the five serial arm resonators 32c1, 32c2, 32c3, 32c4, and 32c5 from the terminal 21d to the terminal 22d. The parallel arm resonator 34c1 disposed closest to the terminal 21d includes one end coupled between the serial arm resonator 32c1 closest to the terminal 21d and the different serial arm resonator 32c2 coupled in series to the serial arm resonator 32c1, and the other end coupled to the terminal 21c. The parallel arm resonator 34c4 disposed closest to the terminal 22d includes one end coupled between the serial arm resonator 32c5 closest to the terminal 22d and the different serial arm resonator 32c4 coupled in series to the serial arm resonator 32c5, and the other end coupled to the terminal 21c. This configuration causes the receive filter of Band 38 to pass a receive signal of Band 38.

In this case, the radio-frequency module 1 may have a configuration in which Band 38 is simultaneously used.

In the case in which the radio-frequency module 1 uses Band 30, as illustrated in FIGS. 2B and 3B, the switch unit 10 does not couple between the terminal 11a and the terminal 12a which are in the open state. In addition, the switch 40b couples the terminal 11a to the terminal 12b. Thus, the terminal 21b of the receive filter of Band 30 receives a signal of Band 30 from the antenna 2 via the terminal 12b and the terminal 11a.

The frequency characteristics of the radio-frequency module 1 illustrated in FIGS. 3A and 3B will be described below in comparison with a radio-frequency module according to a comparative example.

Figure 4A:
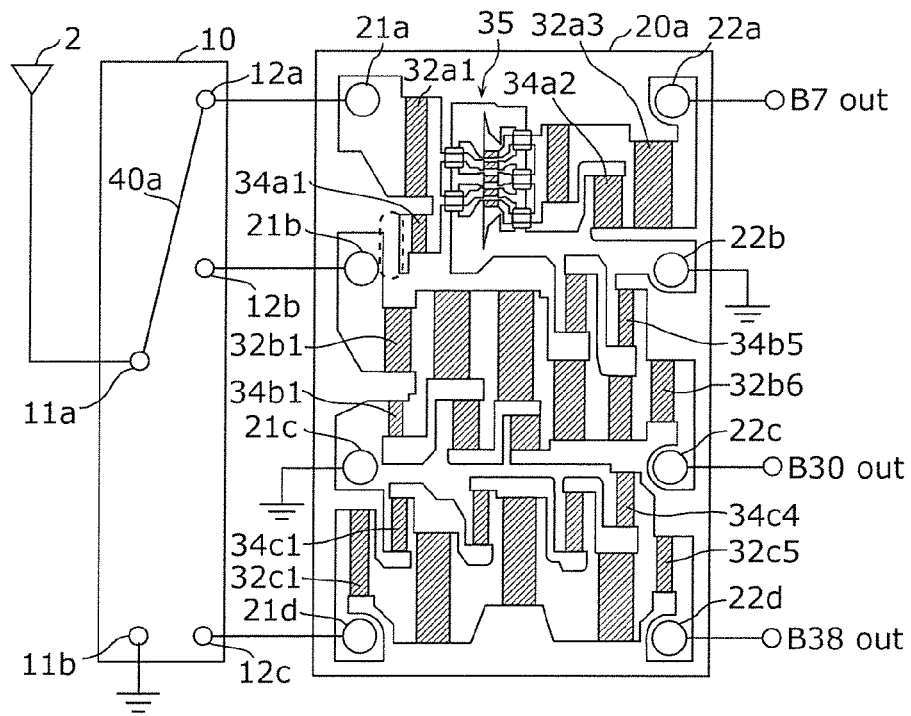
FIG. 4A is a schematic plan view of a circuit configuration of a radio-frequency module according to a comparative example.
Figure 4B:
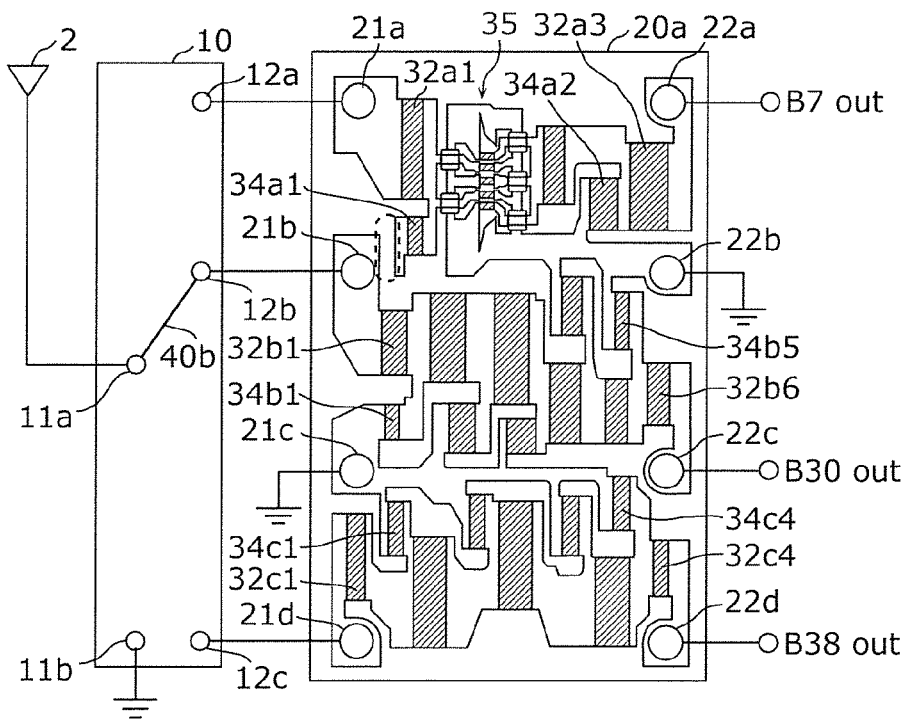
FIG. 4B is a schematic plan view of a circuit configuration of a radio-frequency module according to a comparative example.

FIGS. 4A and 4B are schematic plan views of the circuit configuration of the radio-frequency module according to the comparative example. As illustrated in FIGS. 4A and 4B, the radio-frequency module according to the comparative example includes the switch unit 10 and a multi-filter unit 20a. Similarly to the multi-filter unit 20 of the radio-frequency module 1 according to the present preferred embodiment, the multi-filter unit 20a is a 3in3out triple SAW filter in which Band 7, Band 30, and Band 38 are provided on a single piezoelectric substrate.

In the multi-filter unit 20a, as illustrated by using the dashed lines in FIGS. 4A and 4B, the receive filter of Band 7 has a configuration in which the parallel arm resonator 34a1 disposed closest to the terminal 21a is coupled to the terminal 22b, not to the terminal 21b of the receive filter of Band 30. In contrast, as illustrated in FIGS. 3A and 3B, in the multi-filter unit 20 according to the present preferred embodiment, the receive filter of Band 7 has the configuration in which the parallel arm resonator 34a1 disposed closest to the terminal 21a is coupled to the terminal 21b of the receive filter of Band 30.

Figure 5A:
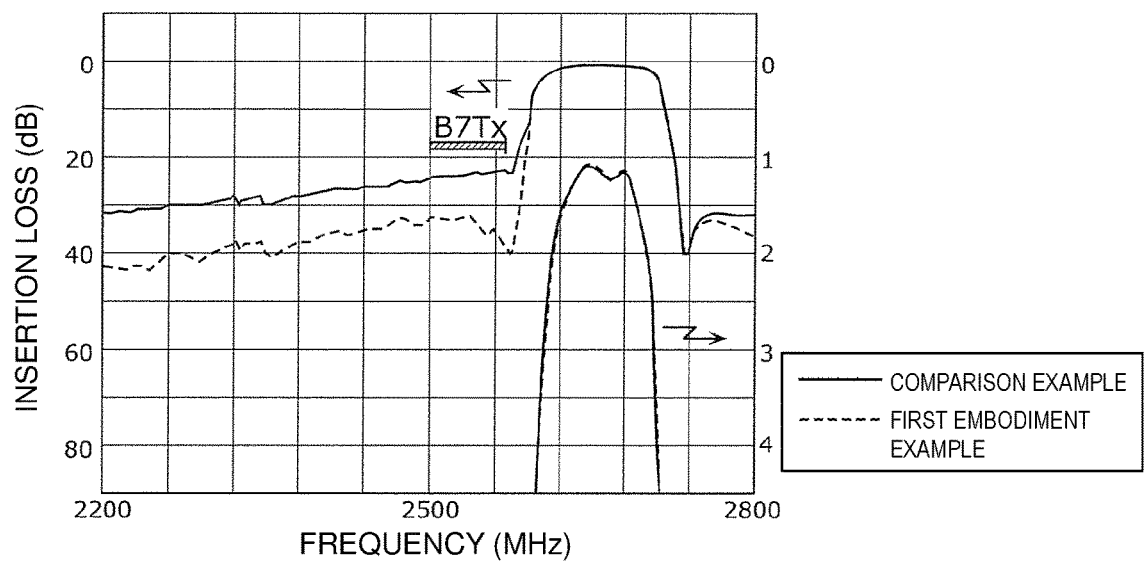
FIGS. 5A and 5B include diagrams illustrating bandpass characteristics, for Band 7, of a radio-frequency module according to the first preferred embodiment of the present invention and a radio-frequency module according to a comparative example.
Figure 5B:
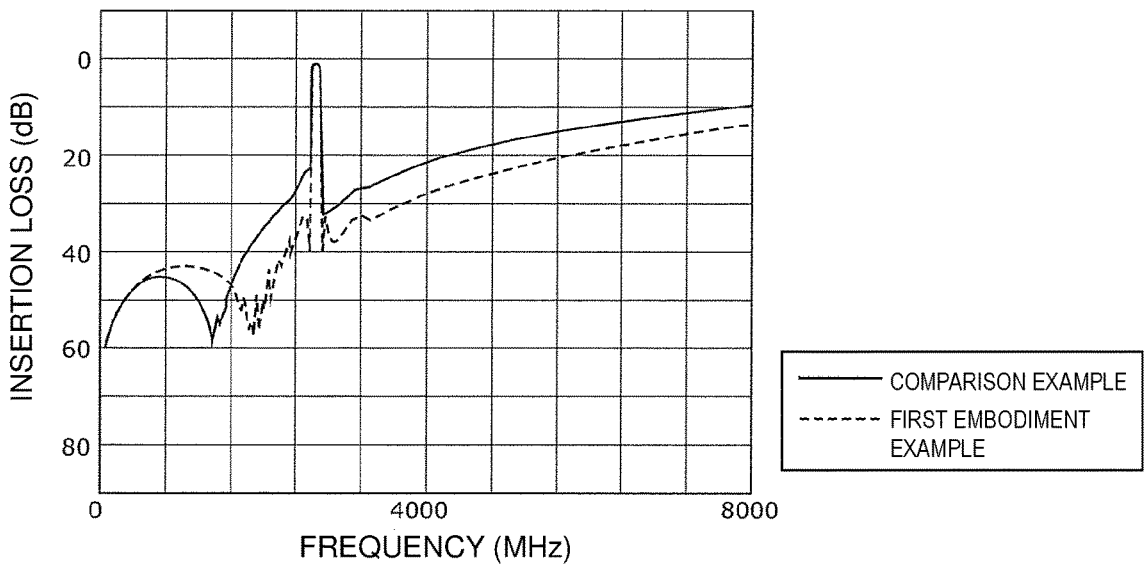

FIGS. 5A and 5B include diagrams illustrating bandpass characteristics, for Band 7, of the radio-frequency module 1 according to the present preferred embodiment and the radio-frequency module according to the comparative example. In FIGS. 5A and 5B, FIG. 5A indicates the bandpass characteristics in the frequencies between about 2200 MHz and about 2800 MHz; FIG. 5B indicates the bandpass characteristics in the frequencies between about 30 MHz and about 8000 MHz. In FIGS. 5A and 5B, the solid line indicates the bandpass characteristic of the radio-frequency module according to the comparative example; the dashed line indicates, as an example of a first preferred embodiment, the bandpass characteristic of the radio-frequency module 1 according to the present preferred embodiment.

The passband of Band 7 has a receive band from about 2620 MHz to about 2690 MHz, and a transmit band from about 2500 MHz to about 2570 MHz. In the case in which the radio-frequency module 1 is used as a receive filter, as illustrated in FIG. 5A, the bandpass characteristic, for Band 7, of the radio-frequency module 1 has a smaller change in insertion loss in the receive band compared with the bandpass characteristic, for Band 7, of the radio-frequency module according to the comparative example, thus having good characteristics. In addition, as illustrated in FIGS. 5A and 5B, outside the receive band, the bandpass characteristic, for Band 7, of the radio-frequency module 1 has an increased attenuation compared with the bandpass characteristic, for Band 7, of the radio-frequency module according to the comparative example. For example, in the transmit band indicated by B7Tx in FIG. 5A, the bandpass characteristic, for Band 7, of the radio-frequency module 1 has an attenuation increased by about 9 dB, compared with the bandpass characteristic, for Band 7, of the radio-frequency module according to the comparative example. That is, the bandpass characteristic, for Band 7, of the radio-frequency module 1 has better characteristics than the bandpass characteristic, for Band 7, of the radio-frequency module according to the comparative example. This occurs from the following reason. In the filter 30a corresponding to Band 7, the terminal 21b is coupled to the GND terminal via the terminals 12b and 11b of the switch unit 10. Thus, the GND of the parallel arm resonator 34a1 disposed closest to the terminal 21a is separate from the other GNDs of the same filter circuit on the chip, causing the inductance component produced at the GND terminal to be reduced. Therefore, the configuration of the radio-frequency module 1 enables improvement in the bandpass characteristic of the filter 30a corresponding to Band 7, without an increase in the total number of the terminals in the multi-filter unit 20.

Figure 6A:
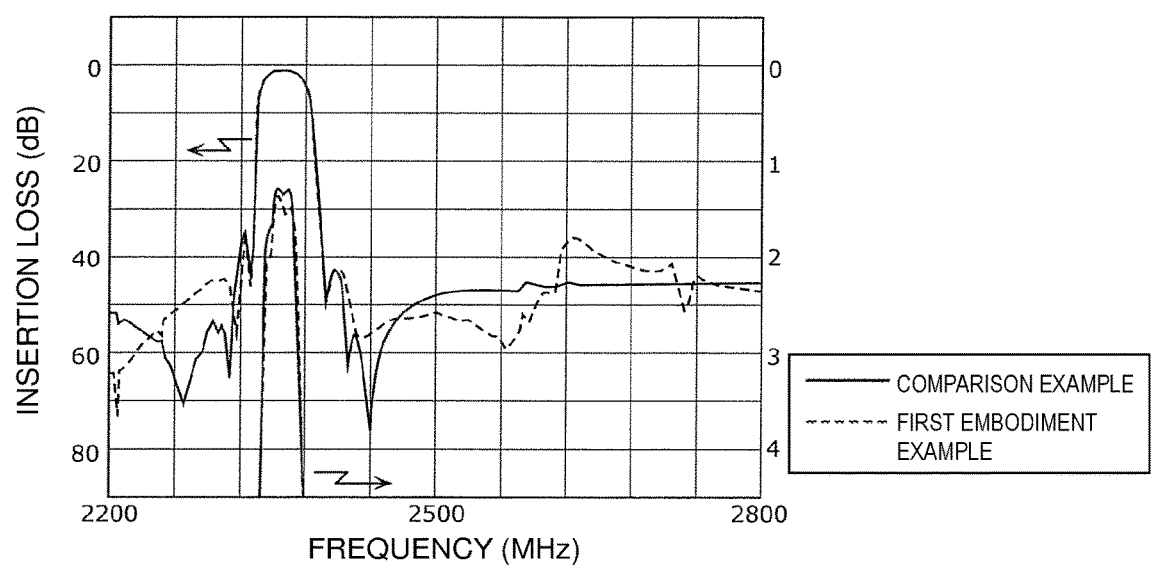
FIGS. 6A and 6B include diagrams illustrating bandpass characteristics for Band 30 which are obtained in the case in which a terminal of the filter 30a is open, in a radio-frequency module according to the first preferred embodiment of the present invention and a radio-frequency module according to a comparative example.
Figure 6B:
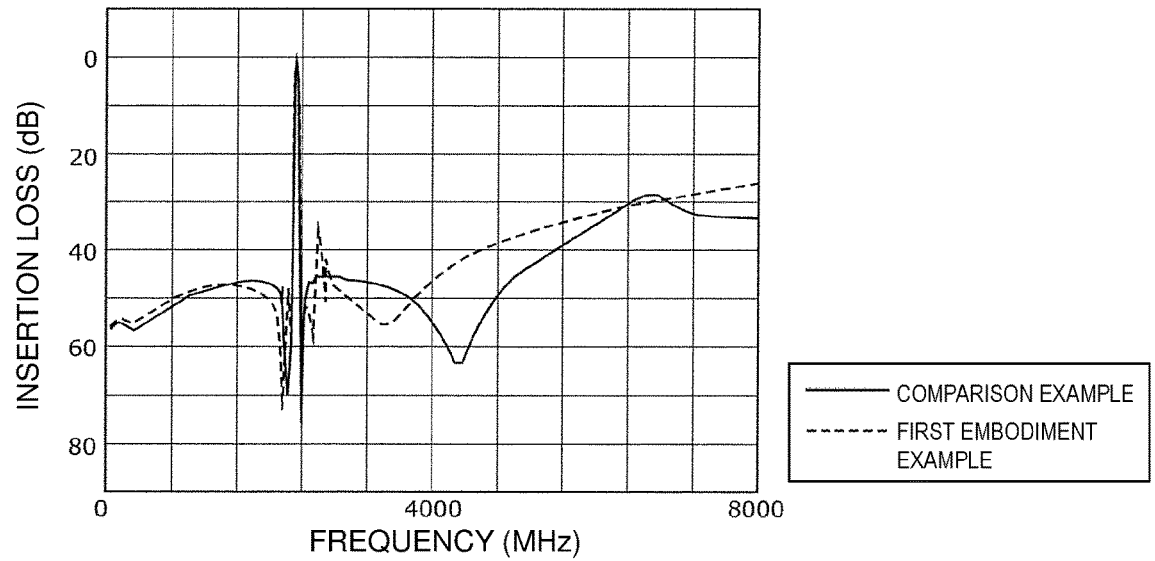
Figure 7A:
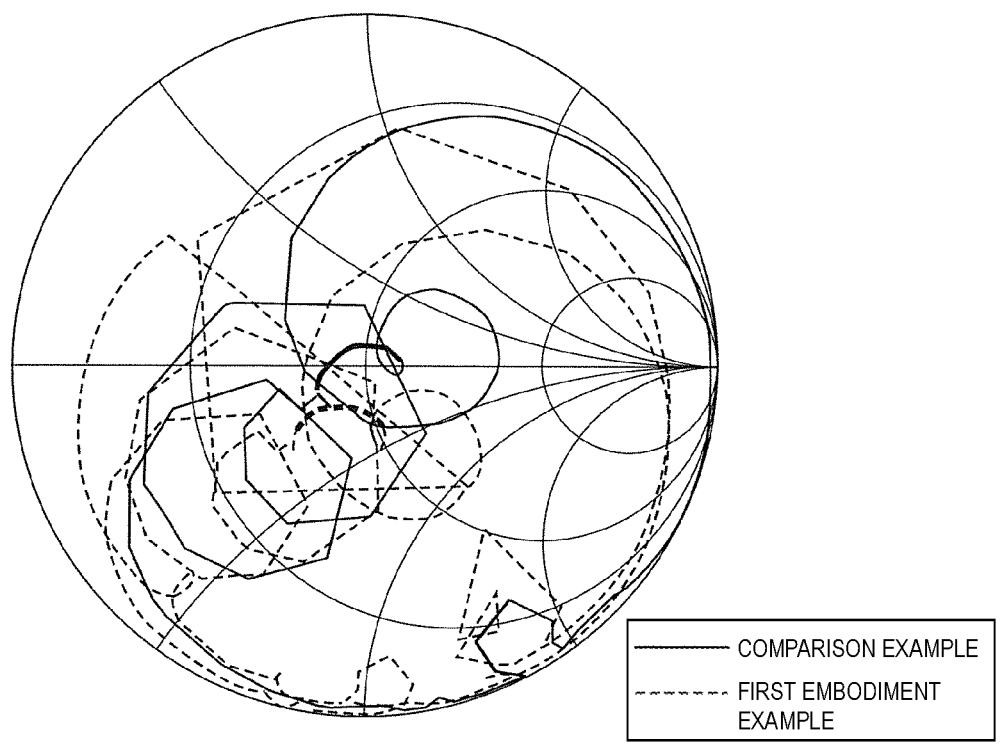
FIGS. 7A and 7B include diagrams illustrating reflection characteristics for Band 30 which are obtained in the case in which a terminal of the filter 30a is open, in a radio-frequency module according to the first preferred embodiment of the present invention and a radio-frequency module according to a comparative example.
Figure 7B:
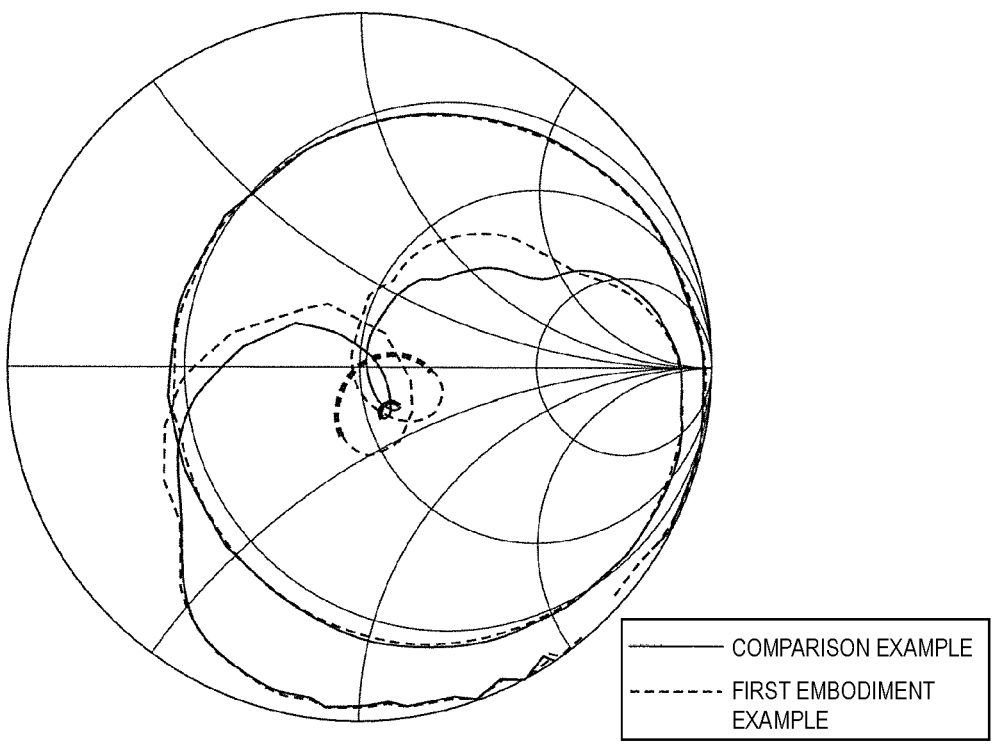

FIGS. 6A and 6B include diagrams illustrating bandpass characteristics for Band 30 which are obtained in the case in which, as illustrated in FIG. 3B, the terminal 12a coupled to the terminal 21a is open and the terminals 11a is coupled to 12b, in the radio-frequency module 1 according to the present preferred embodiment and the radio-frequency module according to the comparative example. In FIGS. 6A and 6B, FIG. 6A illustrates the bandpass characteristics in the frequencies from about 2200 MHz to about 2800 MHz; FIG. 6B illustrates the bandpass characteristics in the frequencies from about 30 MHz to about 8000 MHz. FIGS. 7A and 7B include diagrams illustrating reflection characteristics for Band 30 which are obtained in the case in which the terminal 21a is open, in the radio-frequency module 1 according to the present preferred embodiment and the radio-frequency module according to the comparative example. In FIGS. 7A and 7B, FIG. 7A illustrates the reflection characteristics on the input side; FIG. 7B illustrates the reflection characteristics on the output side. In FIGS. 6A and 6B and FIGS. 7A and 7B, a solid line indicates the bandpass characteristic and the reflection characteristic of the radio-frequency module according to the comparative example; a dashed line indicates, as the example of the first preferred embodiment, the bandpass characteristic and the reflection characteristic of the radio-frequency module 1 according to the present preferred embodiment.

The passband of Band 30 has a receive band from about 2350 MHz to about 2360 MHz, and has a transmit band from about 2305 MHz to about 2315 MHz. In the case in which the radio-frequency module 1 is used as a receive filter, as illustrated in FIG. 6A, the bandpass characteristic, for Band 30, of the radio-frequency module 1 has an insertion loss worsened by about 0.1 dB compared with the bandpass characteristic, for Band 30, of the radio-frequency module according to the comparative example, in the receive band of Band 30. This occurs due to a shift in impedance at the input end.

As illustrated in FIGS. 7A and 7B, compared with the filter 30b according to the comparative example, it was discovered that the impedance at the input end is shifted (changed) in the filter 30b of the radio-frequency module 1. This occurs for the following reason. The parallel arm resonator 34a1 and the serial arm resonator 32a1 of the filter 30a are coupled, in parallel, to the terminal 21b of the filter 30b corresponding to Band 30. Therefore, the impedance of the terminal 21b which defines and functions as an input terminal is changed to capacitive. In this case, the filter 30b may be designed on the presumption that the parallel arm resonator 34a1 and the serial arm resonator 32a1 are coupled in parallel. Alternatively, an inductor may be disposed between a node coupled to the terminal 21b and the GND. Thus, a shift in impedance at the input end is able to be eliminated. For example, a 10 nH inductor is disposed between the terminal 21b and the GND. Thus, the bandpass characteristic in the Band 30 band may be recovered. Instead of the terminal 21b, an inductor may be disposed between the terminal 11a coupled to the terminal 21b and the GND.

As described above, in the radio-frequency module according to the present preferred embodiment, the terminal, which is to be at the reference potential, of the parallel arm resonator 34a1 disposed closest to the terminal 21a in the filter 30a is coupled to the terminal 21b which defines and functions as a common terminal. Thus, the terminal, which is to be at the reference potential, of the parallel arm resonator 34a1 disposed closest to the terminal 21a in the filter 30a may be coupled to the GND terminal via the terminal 21b, the terminal 12b, and the terminal 11b, thus achieving good filter characteristics of the filter 30a.

It is not necessary to provide a new terminal such that the terminal, which is to be at the reference potential, of the parallel arm resonator 34a1 disposed closest to the terminal 21a in the filter 30a is coupled to the GND terminal, thus causing no change in the number of terminals on a single chip. Therefore, an increase in the size of the radio-frequency module is reduced or prevented, thus achieving a small-size module.

In the preferred embodiment described above, the example of a triple filter including the three filters 30a, 30b, and 30c is described as the configuration of the multi-filter unit 20. Alternatively, the multi-filter unit 20 may be a dual filter including two filters, or may include four or more filters. The example of SAW filters is described as the filters 30a, 30b, and 30c. Alternatively, the filters 30a, 30b, and 30c may be BAW filters (bulk elastic wave filters), or may have a filter structure other than these.

Second Preferred Embodiment

A second preferred embodiment of the present invention will be described. A radio-frequency module according to the present preferred embodiment is different from the radio-frequency module 1 according to the first preferred embodiment in that, when using Band 30, the terminal 21a is coupled to the GND terminal.

Figure 8:
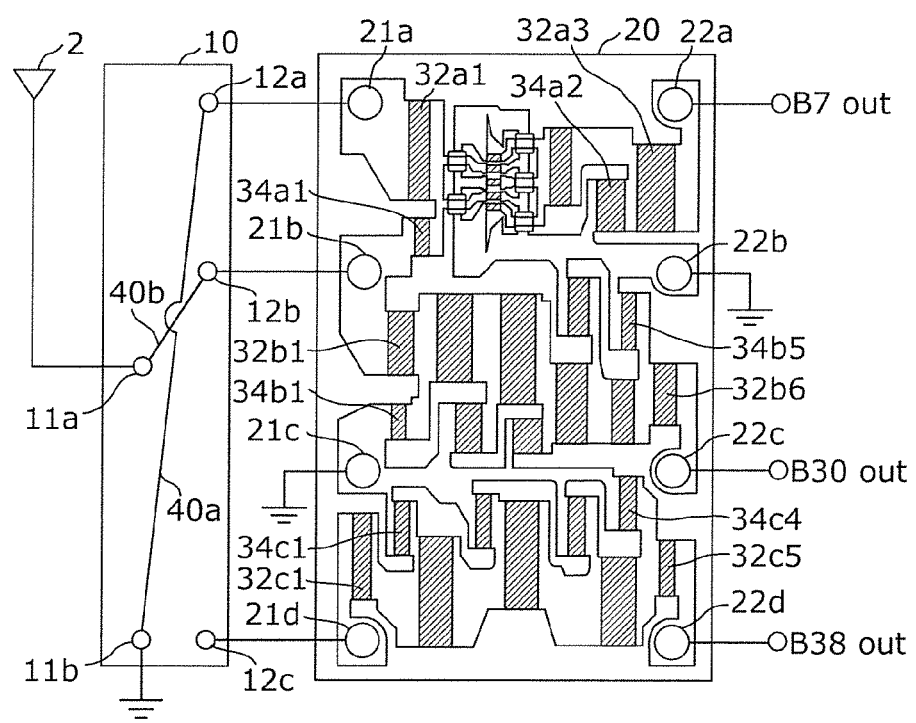
FIG. 8 is a schematic plan view of the circuit configuration using Band 30, in a radio-frequency module according to a second preferred embodiment of the present invention.

FIG. 8 is a schematic plan view of the circuit configuration in use of Band 30, in the radio-frequency module according to the present preferred embodiment.

As illustrated in FIG. 8, in the radio-frequency module according to the present preferred embodiment, the configuration of the multi-filter unit 20 is similar to the configuration of the radio-frequency module 1 according to the first preferred embodiment. In the radio-frequency module according to the present preferred embodiment, when using Band 30, the terminal 12b and the terminal 11a of the switch unit 10 are coupled to each other. Thus, the terminal 21b of the filter 30b corresponding to Band 30 of the multi-filter unit 20 is coupled to the terminal 11a through which a signal is received from the antenna 2.

The switch unit 10 couples the terminal 12a to the terminal 11b. Thus, the terminal 21a of the filter 30a corresponding to Band 7 is coupled to the GND terminal of the switch unit 10 via the terminal 12a and the terminal 11b. The terminal 11a is not coupled to the terminal 12a.

The frequency characteristics, which is obtained at that time, of the radio-frequency module according to the present preferred embodiment will be described in comparison with the radio-frequency module according to the comparative example.

Figure 9A:
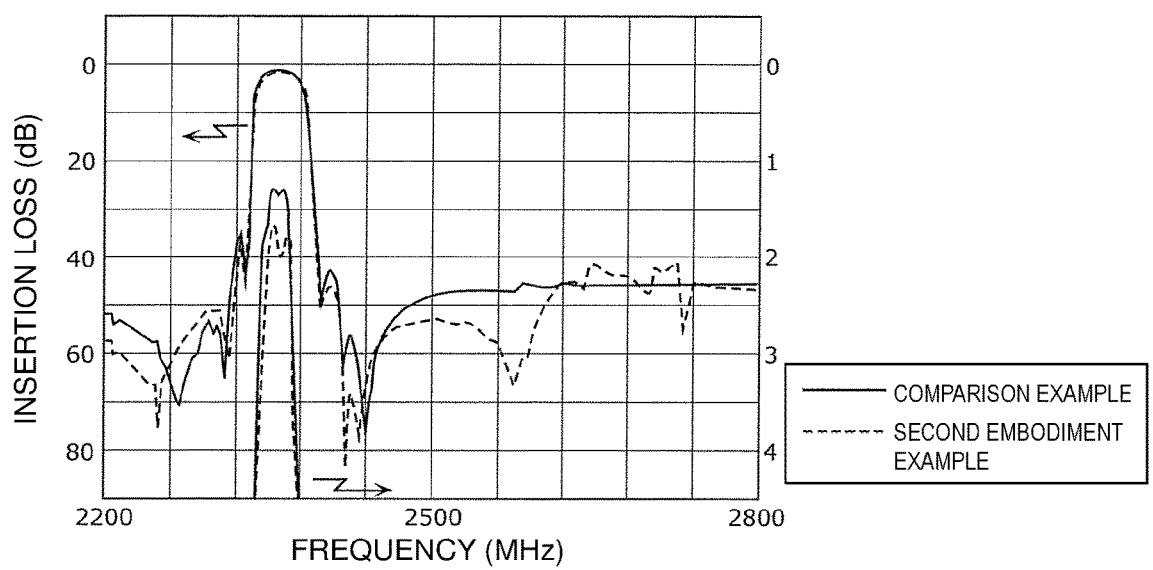
FIGS. 9A and 9B include diagrams illustrating bandpass characteristics for Band 30 which are obtained in the case in which a terminal of the filter 30a is coupled to a GND terminal, in a radio-frequency module according to the second preferred embodiment of the present invention.
Figure 9B:
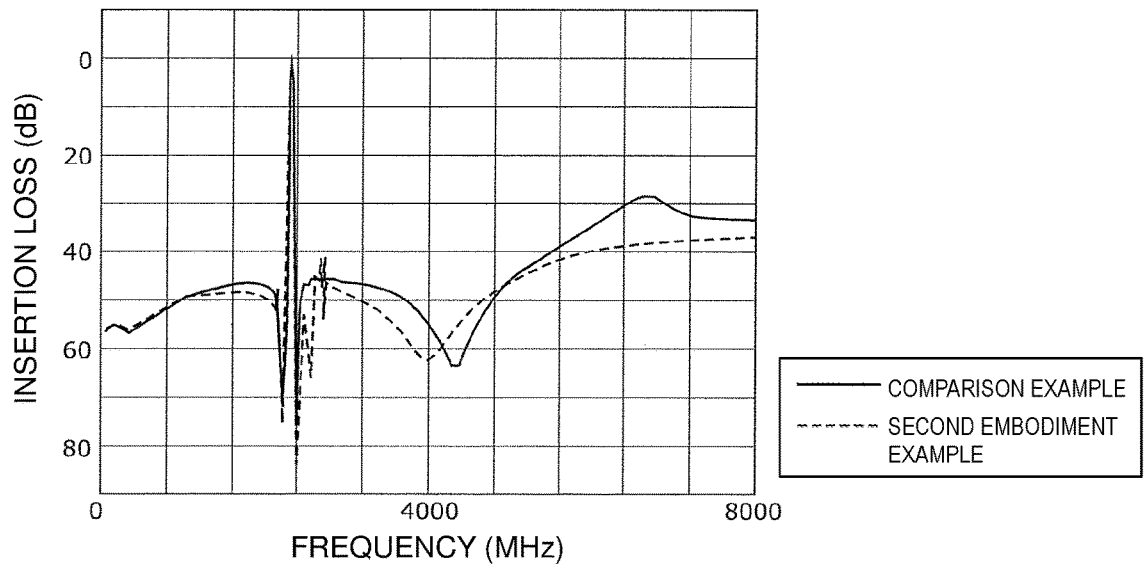
Figure 10A:
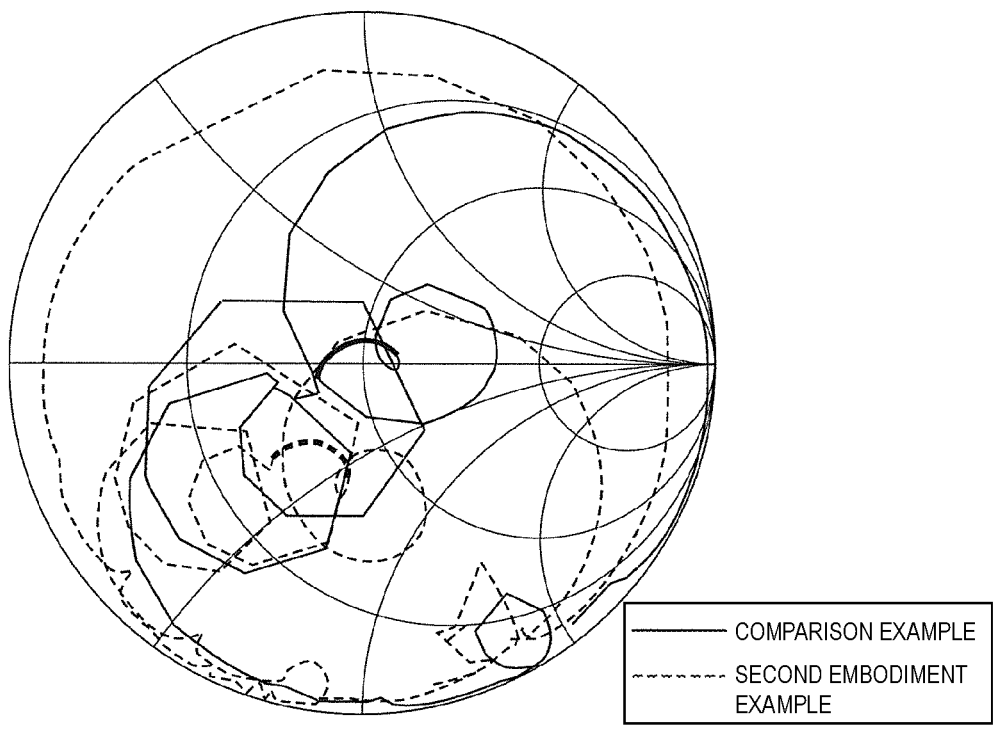
FIGS. 10A and 10B include diagrams illustrating reflection characteristics for Band 30 which are obtained in the case in which a terminal of the filter 30a is coupled to a GND terminal, in a radio-frequency module according to the second preferred embodiment of the present invention.
Figure 10B:
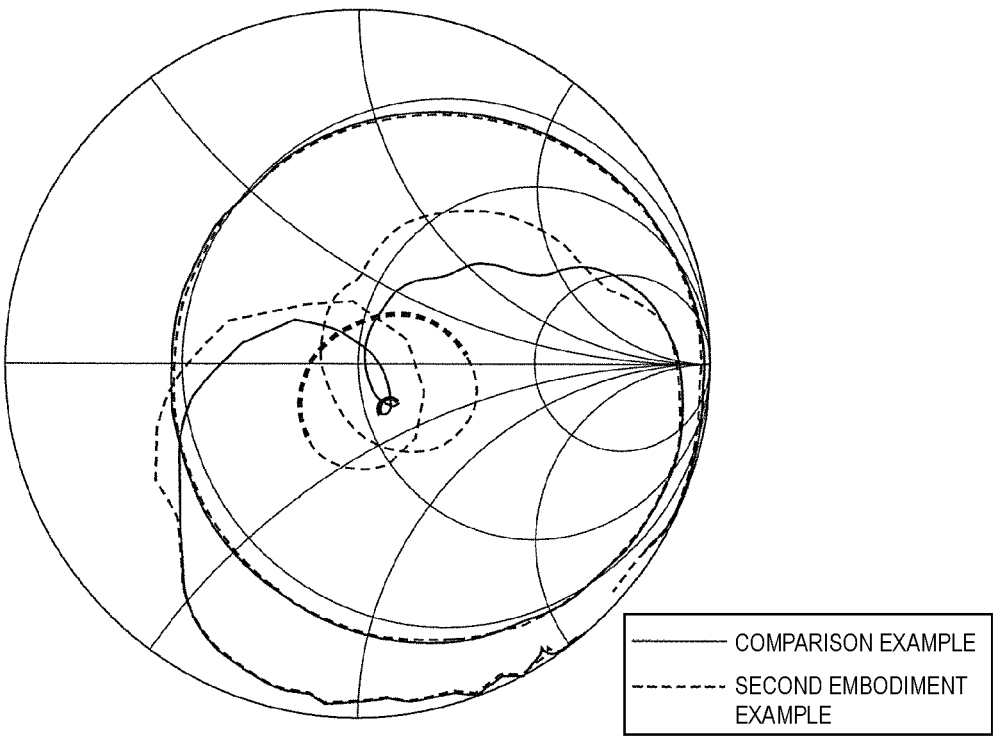

FIGS. 9A and 9B include diagrams illustrating bandpass characteristics for Band 30 which are obtained in the case in which the terminal 21a is coupled to the GND terminal, in the radio-frequency module according to the present preferred embodiment. In FIGS. 9A and 9B. 9, FIG. 9A illustrates the bandpass characteristics in the frequencies from about 2200 MHz to about 2800 MHz; FIG. 9B illustrates the bandpass characteristics in the frequencies from about 30 MHz to about 8000 MHz. FIGS. 10A and 10B includes diagrams illustrating reflection characteristics for Band 30 which are obtained in the case in which the terminal of the filter 30a is coupled to the GND terminal, in the radio-frequency module according to the present preferred embodiment. In FIGS. 10A and 10B, FIG. 10A illustrates the reflection characteristics on the input side; FIG. 10B illustrates the reflection characteristics on the output side. In FIGS. 9A, 9B and FIGS. 10A and 10B, a solid line indicates the bandpass characteristic and the reflection characteristic of the radio-frequency module according to the comparative example; a dashed line indicates, as an example of a second preferred embodiment, the bandpass characteristic and the reflection characteristic of the radio-frequency module according to the present preferred embodiment.

When, with the terminal 21a of the filter 30a being coupled to the GND terminal of the switch unit 10, the radio-frequency module according to the present preferred embodiment is used as the receive filter, the bandpass characteristic, for Band 30, of the radio-frequency module according to the present preferred embodiment has an insertion loss worsened by about 0.5 dB compared with the bandpass characteristic, for Band 30, of the radio-frequency module according to the comparative example, in the receive band of Band 30, as illustrated in FIG. 9A. This may be worse than the case in which the terminal 21a of the filter 30a is open in the first preferred embodiment.

However, as illustrated in FIGS. 9A and 9B, a new attenuation pole appears outside the receive band of Band 30. For example, as illustrated in FIG. 9A, an attenuation pole appears at the frequency of about 2565 MHz included in the transmit band of Band 7. This attenuation is increased compared with the case in which the terminal 21a of the filter 30a is open in the first preferred embodiment. Therefore, the attenuation in the transmit band of Band 7 is increased compared with the case in which the terminal 21a of the filter 30a is open in the first preferred embodiment, and the bandpass characteristic of the filter 30b corresponding to Band 30 is able to be improved. As illustrated in FIG. 9B, the difference between the bandpass characteristic, for Band 30, of the radio-frequency module according to the present preferred embodiment and the bandpass characteristic of the radio-frequency module according to the comparative example is smaller, as a whole, compared with the case in which the terminal 21a of the filter 30a is open. Therefore, the bandpass characteristic in the receive band of the filter 30b is able to be improved.

As illustrated in FIGS. 10A and 10B, it was discovered that, in the filter 30b of the radio-frequency module, the impedance at the input end is shifted (changed) compared with the filter 30b according to the comparative example. The amount of the impedance shift at the input end is larger compared with the case in which the terminal 21a of the filter 30a is open in the first preferred embodiment. This occurs because coupling of the terminal 21a of the filter 30a to the GND terminal produces a larger change to the capacitive component in the impedance of the terminal 21b which defines and functions as an input terminal.

In this case, the filter 30b may be designed on the presumption that the parallel arm resonator 34a1 and the serial arm resonator 32a1 are coupled in parallel and that the terminal 21a is coupled to the GND terminal. Alternatively, a shift in impedance at the input end may be eliminated by disposing an inductor between a node coupled to the terminal 21b and the GND. For example, a 5-nH inductor is disposed between the terminal 21b and the GND. This enables the transmittance characteristic in the Band-30 band to be recovered. Instead of the terminal 21b, an inductor may be disposed between the terminal 11a coupled to the terminal 21b and the GND.

As described above, when the bandpass characteristic of the filter 30b which is obtained in the case in which the terminal 21a of the filter 30a is coupled to the GND terminal of the switch unit 10 is compared with that in the case in which the terminal 21a of the filter 30a is open, there are the following characteristics.

In the case in which the terminal 21a of the filter 30a is coupled to the GND terminal of the switch unit 10, compared with the case in which the terminal 21a of the filter 30a is open, the bandpass characteristic in the transmit band of Band 7 is improved. Also in the receive band of Band 7, in the case in which the terminal 21a of the filter 30a is coupled to the GND terminal of the switch unit 10, compared with the case in which the terminal 21a of the filter 30a is open, the deterioration in the bandpass characteristic is small, thus achieving further improvement of the bandpass characteristic in the receive band.

In the case in which the terminal 21a of the filter 30a is coupled to the GND terminal of the switch unit 10, the amount of the shift in impedance at the input end is larger compared with the case in which the terminal 21a of the filter 30a is open. The filter 30b may be designed in consideration of such a shift in impedance, or an inductor may be disposed between a node coupled to the terminal 21b and the GND to address the shift in impedance at the input end, thus achieving good bandpass characteristic of the filter 30b.

Therefore, the radio-frequency module according to the present preferred embodiment is able to improve the characteristics of Band 7 without worsening the characteristics of Band 30, and the filter 30a may be coupled to multiple GND terminals without changing the number of terminals in the multi-filter unit 20. Accordingly, the configuration of the radio-frequency module according to the present preferred embodiment achieves both of good filter characteristics and a reduction in the size.

Figure 11:
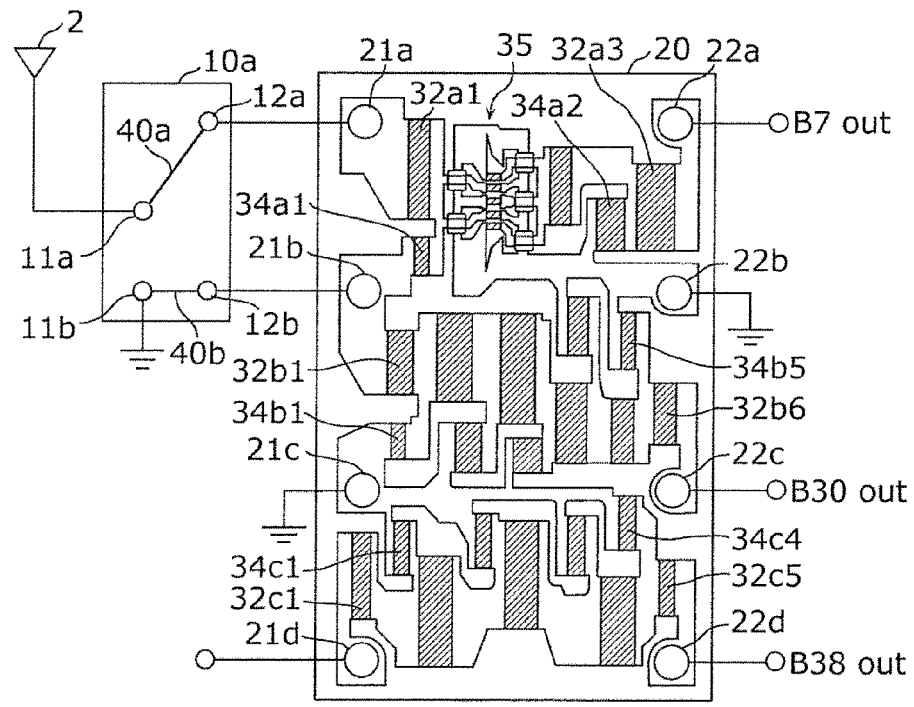
FIG. 11 is a schematic plan view of the circuit configuration using Band 7, in a radio-frequency module according to a modified example of a preferred embodiment of the present invention.

A modified example of the first and second preferred embodiments described above will be described. FIG. 11 is a schematic plan view of the circuit configuration using Band 7, in a radio-frequency module according to the present modified example.

In the preferred embodiments described above, the switch unit 10 has the configuration including the terminals 11a, 11b, 12a, 12b, and 12c corresponding to Band 7, Band 30, and Band 38. However, the configuration of the switch unit 10 is not limited to this. For example, as described below, a switch which does not switch between coupling destinations is not necessarily provided on the chip on which the other switch is provided.

As illustrated in FIG. 11, a switch unit 10a according to the present modified example includes the terminals 11a and 11b and the terminals 12a and 12b. The switch unit 10a is different from the switch unit 10 described in the first preferred embodiment in that the terminal 12c is not provided on the chip on which the terminals 11a, 11b, 12a, and 12b are provided.

In the radio-frequency module illustrated in FIG. 11, at the terminal 21d of the filter 30c corresponding to Band 38, switching is not performed between the GND terminal and the receive/transmit terminal through which a signal is received/transmitted from/to the antenna 2. Therefore, the terminal 21d does not require switching. Accordingly, in the switch unit 10a, only the terminals 11a, 11b, 12a, and 12b which are coupled to the switches 40a and 40b and which require switching are provided. Thus, a reduction in the size of the switch unit 10a is achieved.

Third Preferred Embodiment

Figure 12:
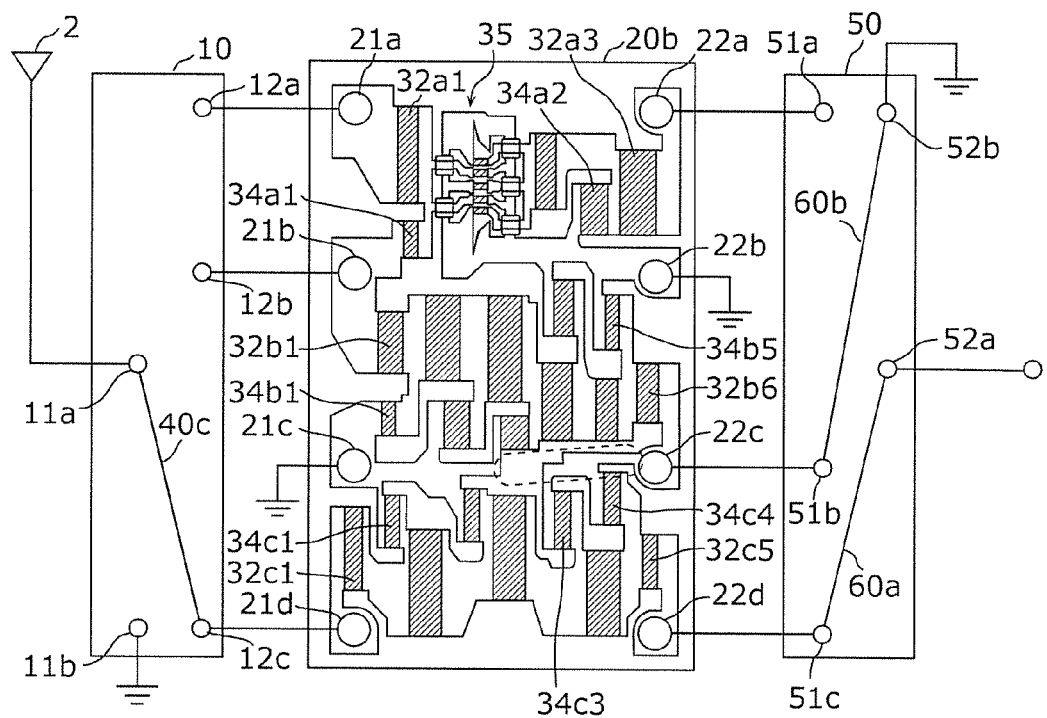
FIG. 12 is a schematic plan view of the circuit configuration using Band 38, in a radio-frequency module according to a third preferred embodiment of the present invention.
Figure 13:
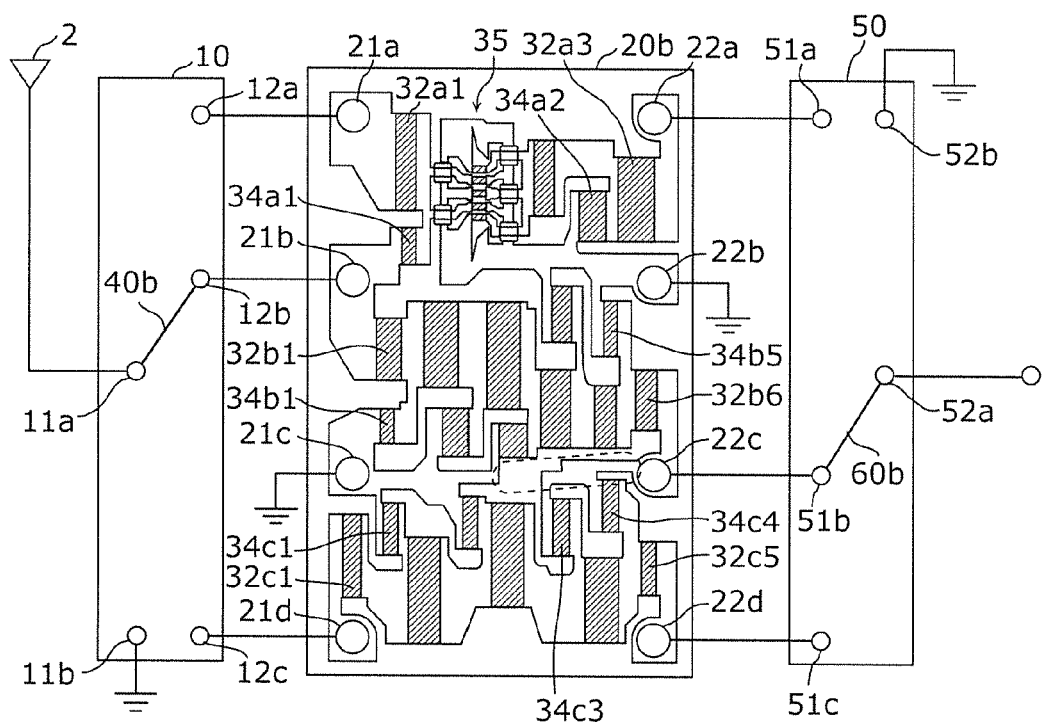
FIG. 13 is a schematic plan view of the circuit configuration using Band 30, in a radio-frequency module according to the third preferred embodiment of the present invention.

A third preferred embodiment of the present invention will be described below. FIG. 12 is a schematic plan view of the circuit configuration using Band 38, in a radio-frequency module according to the present preferred embodiment. FIG. 13 is a schematic plan view of the circuit configuration using Band 30, in the radio-frequency module according to the present preferred embodiment.

In the preferred embodiments described above, the multi-filter unit 20 has the configuration in which only the terminal 21b is included as a common terminal. Alternatively, the multi-filter unit 20 may have a configuration in which multiple common terminals are included.

As illustrated in FIG. 12, the radio-frequency module according to the present preferred embodiment includes the switch unit 10, a multi-filter unit 20b, and a switch unit 50.

Similarly to the radio-frequency module 1 described in the first preferred embodiment, the multi-filter unit 20b includes the filters 30a, 30b, and 30c. The terminal 11a and the terminal 12c are coupled to each other by a switch 40c. The filter 30a and the filter 30b correspond to the second circuit device and the first circuit device, respectively. The terminal 21b corresponds to the common terminal. In the multi-filter unit 20b, the terminals 22a, 22c, and 22d correspond to the input/output terminals. The terminals 22a, 22c, and 22d are HOT terminals.

As illustrated by a dashed line in FIG. 12, the terminal, which is to be at the reference potential, of the parallel arm resonators 34c4 and 34c3 of the filter 30c is coupled to the terminal 22c. That is, the terminal 22c corresponds to the common terminal. In this case, the filter 30c corresponds to the second circuit device. Therefore, the multi-filter unit 20b includes two filter sets defined by different filter combinations, the filter 30a and the filter 30b, and the filter 30b and the filter 30c. The filter 30b corresponding to the first circuit device includes the terminal 21b and the terminal 22c as common terminals.

The switch unit 50 includes terminals 51a, 51b, 51c, 52a and 52b. The terminals 51a, 51b, and 51c are coupled to the terminals 22a, 22c, and 22d of the multi-filter unit 20b, and through which signals are received/transmitted between the multi-filter unit 20b and a downstream circuit (not illustrated). That is, the terminals 51a, 51b, and 51c correspond to the receive/transmit terminals.

The terminals 52a and 52b are coupled to the circuit (not illustrated) downstream of the multi-filter unit 20b, and are output terminals through which signals are output to the downstream circuit. The terminal 52b is coupled to a GND terminal of the mount board (not illustrated) of the radio-frequency module.

The switch unit 50 also includes switches 60a and 60b. The switch unit 50 couples the terminal 51c to the terminal 52a using the switch 60a. The switch unit 50 also couples the terminal 51b to the terminal 52a using the switch 60b. The switch unit 50 switches the coupling destination of the terminal 51b to the terminal 52b using the switch 60b, thus coupling the terminal 51b to the terminal 52b. That is, the switch 60b switches the coupling destination of the terminal 51b between the terminal 52a and the terminal 52b which is a GND terminal.

This configuration enables the radio-frequency module according to the present preferred embodiment to switch between Band 30 and Band 38 by switching of the switch unit 50.

The passband of Band 38 has the receive band and the transmit band, both of which are a band from about 2570 MHz to about 2620 MHz. When using Band 38, as illustrated in FIG. 12, the switch unit 50 couples the terminal 51c to the terminal 52a using the switch 60a. The switch 60b couples the terminal 51b to the terminal 52b. Thus, the terminal 22c of the filter 30c is coupled to the GND terminal via the terminal 51b and the terminal 52b. This configuration causes the filter 30c to pass a receive/transmit signal of Band 38. The filter 30c corresponding to Band 38 corresponds to the second circuit device.

When using Band 30, as illustrated in FIG. 13, the switch unit 50 does not couple the terminal 51c to the terminal 52b, thus making the terminal 51c and the terminal 52b open. In addition, the switch 60b couples the terminal 51b to the terminal 52a. Thus, a signal of Band 30 is output from the terminal 22c of the filter 30b to the downstream circuit via the terminal 51b and the terminal 52a. The filter 30b corresponding to Band 30 corresponds to the first circuit device.

When using Band 30, the switch unit 50 may couple the terminal 51c to the terminal 52b using the switch (not illustrated). Thus, the parallel arm resonator 34c4 and the serial arm resonator 32c5 of the filter 30c may be coupled to the GND terminal. According to this configuration, similarly to the radio-frequency module according to the second preferred embodiment, the radio-frequency module according to the present preferred embodiment achieves improved characteristics of Band 38 without worsening the characteristics of Band 30, and enables the filter 30c to be coupled to the multiple GND terminals without changing the number of terminals in the multi-filter unit 20b. Therefore, both of better filter characteristics and a reduction in the size are achieved.

In the radio-frequency module according to the present preferred embodiment, the switch units 10 and 50 are disposed on both of the input side and the output side of the multi-filter unit 20b. The arrangement of the switch units is not limited to this. The switch unit 50 may be disposed only at the input/output terminals (terminals 22a, 22b, 22c, and 22d) of the multi-filter unit 20b on the opposite side from the antenna 2.

The present invention is not limited to the configurations described in the preferred embodiments described above. For example, as in a modified example described below, changes may be appropriately made.

For example, in the preferred embodiments described above, the filters 30a, 30b, and 30c correspond to Band 7, Band 30, and Band 38, respectively. Alternatively, the filters 30a, 30b, and 30c may correspond to other frequency bands.

In the preferred embodiments described above, the example of a triple filter including the three filters 30a, 30b, and 30c is described as the configuration of the multi-filter unit 20. The multi-filter unit 20 may be a dual filter including two filters, or may be a filter including four or more filters.

The configurations of the filters 30a, 30b, and 30c are not limited to the configurations described above. The number of parallel arm resonators, the number of serial arm resonators, and combinations thereof may be varied. For example, a ladder filter obtained by combining at least one parallel arm resonator and at least one serial arm resonator may be used. Alternatively, a combination of a ladder filter and a longitudinally coupled filter may be used.

The example using SAW filters as the filters 30a, 30b, and 30c is described. However, BAWs may be used, or a filter structure other than these may be used. Other than a filter structure, other circuit devices, such as switching devices, for example, may be used.

In the preferred embodiments described above, the switch unit 10 has the configuration in which the terminals 11a, 11b, 12a, 12b, and 12c corresponding to all of Band 7, Band 30, and Band 38 are provided on the same chip. The configuration of the switch unit 10 is not limited to this. For example, a switch which is not required to switch between the coupling destinations is not necessarily provided on the chip on which the other switch is provided.

Further, preferred embodiments obtained by making various changes conceived by those skilled in the art to the above-described preferred embodiments and modified example, or preferred embodiments provided by combining any components and functions in the above-described preferred embodiments and modified example without departing from the gist of the present invention are also included in the present invention.

Preferred embodiments of the present invention may be applied to communication equipment, such as a multiplexer, a multi-filter, a transmission device, and a reception device, for example, which uses a radio-frequency module having multiple filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module comprising:
a multi-filter unit that includes a plurality of circuit devices having different passbands of signals, each of the plurality of circuit devices including a plurality of input/output terminals, the plurality of input/output terminals being terminals through which the signals are input or output; and
a switch unit that includes a receive/transmit terminal and a GND terminal, the receive/transmit terminal being a terminal to receive/transmit the signals, and that switches coupling destinations to the receive/transmit terminal or the GND terminal, the coupling destinations being destinations of the input/output terminals of the plurality of circuit devices; wherein
in a first circuit device among the plurality of circuit devices, at least one of the input/output terminals is a common terminal coupled to a terminal in a second circuit device, the terminal in the second circuit device being structured to be at a reference potential, the second circuit device being different from the first circuit device and being among the plurality of circuit devices; and
when one of the input/output terminals of the second circuit device is to be coupled to the receive/transmit terminal, the switch unit switches the coupling destination of the common terminal to the GND terminal.

2. The radio-frequency module according to claim 1, wherein, when the input/output terminal of the first circuit device is to be coupled to the receive/transmit terminal, the switch unit opens the input/output terminal of the second circuit device.

3. The radio-frequency module according to claim 1, wherein, when the input/output terminal of the first circuit device is to be coupled to the receive/transmit terminal, the switch unit couples the input/output terminal of the second circuit device to the GND terminal.

4. The radio-frequency module according to claim 1, wherein at least one of the plurality of circuit devices is a surface acoustic wave filter.

5. The radio-frequency module according to claim 4, wherein
the surface acoustic wave filter is a ladder filter circuit including one or more serial arm resonators and one or more parallel arm resonators; and
a terminal that is structured to be at the reference potential in at least one of the parallel arm resonators is coupled to the common terminal.

6. The radio-frequency module according to claim 1, wherein the plurality of circuit devices are provided on a same chip.

7. The radio-frequency module according to claim 1, wherein the multi-filter unit includes, on a same chip, a plurality of sets of different combinations from the first circuit device and the second circuit device, and, in each of the different combinations of the first circuit device and the second circuit device, the first circuit device includes the common terminal.

8. The radio-frequency module according to claim 1, wherein the plurality of circuit devices are provided on a same chip.

9. A multiplexer comprising:
a plurality of the radio-frequency modules according to claim 1.

10. The multiplexer according to claim 9, wherein, in at least one of the plurality of radio-frequency modules, when the input/output terminal of the first circuit device is to be coupled to the receive/transmit terminal, the switch unit opens the input/output terminal of the second circuit device.

11. The multiplexer according to claim 9, wherein, in at least one of the plurality of radio-frequency modules, when the input/output terminal of the first circuit device is to be coupled to the receive/transmit terminal, the switch unit couples the input/output terminal of the second circuit device to the GND terminal.

12. The multiplexer according to claim 9, wherein, in at least one of the plurality of radio-frequency modules, at least one of the plurality of circuit devices is a surface acoustic wave filter.

13. The multiplexer according to claim 12, wherein, in at least one of the plurality of radio-frequency modules,
the surface acoustic wave filter is a ladder filter circuit including one or more serial arm resonators and one or more parallel arm resonators; and
a terminal that is structured to be at the reference potential in at least one of the parallel arm resonators is coupled to the common terminal.

14. The multiplexer according to claim 9, wherein, in at least one of the plurality of radio-frequency modules, the plurality of circuit devices are provided on a same chip.

15. The multiplexer according to claim 9, wherein, in at least one of the plurality of radio-frequency modules, the multi-filter unit includes, on a same chip, a plurality of sets of different combinations from the first circuit device and the second circuit device, and, in each of the different combinations of the first circuit device and the second circuit device, the first circuit device includes the common terminal.

16. A multi-filter comprising:
a plurality of circuit devices having different passbands of signals, each of the plurality of circuit devices including a plurality of input/output terminals, the plurality of input/output terminals being terminals through which the signals are input or output; wherein
in a first circuit device among the plurality of circuit devices, at least one of the input/output terminals is a common terminal coupled to a terminal in a second circuit device, the terminal in the second circuit device being structured to be at a reference potential, the second circuit device being different from the first circuit device and being among the plurality of circuit devices; and
when one of the input/output terminals of the second circuit device is to be coupled to a receive/transmit terminal of a switch unit, the coupling destination of the common terminal is switched by the switch unit to a GND terminal of the switch unit.

17. The multi-filter according to claim 16, wherein, when the input/output terminal of the first circuit device is to be coupled to the receive/transmit terminal the switch unit, the input/output terminal of the second circuit device is opened by the switch unit.

18. The multi-filter according to claim 16, wherein, when the input/output terminal of the first circuit device is to be coupled to the receive/transmit terminal of the switch unit, the input/output terminal of the second circuit device is coupled to a GND terminal of the switch unit.

19. The multi-filter according to claim 16, wherein at least one of the plurality of circuit devices is a surface acoustic wave filter.

20. The multi-filter according to claim 19, wherein
the surface acoustic wave filter is a ladder filter circuit including one or more serial arm resonators and one or more parallel arm resonators; and
a terminal that is structured to be at the reference potential in at least one of the parallel arm resonators is coupled to the common terminal.

* * * * *